(12) United States Patent
Ohkawa et al.

(10) Patent No.: US 6,392,491 B1
(45) Date of Patent: May 21, 2002

(54) HIGH-FREQUENCY AMPLIFIER AND AMPLIFICATION ELEMENT

(75) Inventors: Shigeru Ohkawa; Kiyotaka Takahashi; Takumi Takayashiki, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/474,166

(22) Filed: Dec. 29, 1999

(30) Foreign Application Priority Data

Feb. 25, 1999 (JP) .......................... 11-048472

(51) Int. Cl.⁷ .......................... H03F 3/04; H03F 1/26; H03F 3/60
(52) U.S. Cl. .................. 330/306; 330/149; 330/286; 330/302
(58) Field of Search ................ 330/149, 286, 330/302, 306

(56) References Cited

U.S. PATENT DOCUMENTS

| | | | | |
|---|---|---|---|---|
| 3,737,799 A | * | 6/1973 | Stander | 330/126 |
| 3,987,370 A | * | 10/1976 | Schutz | 330/107 |
| 5,124,668 A | * | 6/1992 | Christian | 330/306 |
| 5,589,799 A | * | 12/1996 | Madaffari et al. | 330/277 |
| 5,712,593 A | * | 1/1998 | Buer et al. | 330/132 |

FOREIGN PATENT DOCUMENTS

| | | |
|---|---|---|
| JP | 5-308227 | 11/1993 |
| JP | 7-94962 | 4/1995 |
| JP | 7-240638 | 9/1995 |
| JP | 7-321561 | 12/1995 |
| JP | 9-121125 | 5/1997 |
| JP | 10-233638 | 9/1998 |

* cited by examiner

Primary Examiner—Robert Pascal
Assistant Examiner—Patricia T. Nguyen
(74) Attorney, Agent, or Firm—Rosenman & Colin LLP

(57) ABSTRACT

The amplification element is configured by amplifying a multicarrier signal by combining plural carrier waves modulated independently There is disclosed a high-frequency amplifier for amplifying multicarrier signals generated by combining plural carrier waves modulated independently. The amplifier performs a predetermined filtering processing at its output end. An amplification element is also disclosed which is integrated with a circuit for suppressing main components of nonlinear distortions, thus forming an integrated circuit.

In electronic appliances, equipments, or systems to which the invention is applied, achievement of reduction in price and size, improvement in reliability, and maintenance and operation being done more efficiently at reduced costs can be accomplished.

14 Claims, 14 Drawing Sheets

HIGH-FREQUENCY AMPLIFIER AND AMPLIFICATION ELEMENT

BACKGROUND OF THE INVENTION

1. Field of the Invention

The present invention relates to a high-frequency amplifier for amplifying a multicarrier signal generated by combining plural carrier waves modulated independently.

2. Description of the Related Art

CDMA (Code Division Multiple Access) system inherently has confidentiality and interference-resistibility and is the multiple access system capable of making efficient use of radio frequencies. Therefore, CDMA system is applied to various communication systems.

Furthermore, CDMA system is being actively applied to mobile communication system since the transmitting power control technology with high response and high accuracy has been established so that the near-far problem is solvable in recent years.

The transmitting section of a radio base station of a mobile communication system to which CDMA system described above is applied is composed of high-frequency amplifiers 101-1 to 101-N which amplify the power of plural N of RF signals that have different frequencies of carrier waves respectively and whose frequencies are assigned based on a given frequency allocation and on the zone configuration and a combiner 102 which generates multicarrier signals to be fed to an antenna system by combining RF signals given respectively by the output of high-frequency amplifiers 101-1 to 101 N as shown in FIG. 13.

It is now assumed that the number N of the RF signals described above is 2, for simplicity. The frequencies of the carrier waves of these RF signals are indicated by $f_1$ and $f_2$, respectively.

In the transmitting section configured as described above, the high-frequency amplifiers 101-1 and 101-2 amplify the electric powers of first and second RF signals, respectively, which contain the frequencies $f_1$ and $f_2$, in the occupied bands.

Since these high-frequency amplifiers 101-1 and 101-2 amplify the first and second RF signals, respectively, even if nonlinear regions are contained in the characteristics of amplification elements provided in the high-frequency amplifiers 101-1 and 101-2, noises are not generated due to cross modulation (intermodulation) of these RF signals. Furthermore, such noises will be hereinafter referred to simply as cross modulation distortion.

In the prior art described above, as the number N of the frequencies of carrier waves assigned to the radio base station increases, the number N of the amplifiers 101-1 to 101-N increases, thus increasing the size of the hardware.

As for the configuration of the hardware of the radio base station, it is generally required to be adaptable to the maximum value Nmax of the number of carrier waves that can be assigned.

However, as for the radio base station, as the size of the hardware increases, constraints on the office establishment, such as floor space and volume needed for installation and power consumption, may become more stringent and the reliability may deteriorate.

The increases of constraints and deterioration of the reliability may be alleviated by a combiniation of a combiner for combining the plural N of RF signals and a single common amplifier for amplifying the multicarrier signals gained from the output of the combiner. However, the common amplifier is required to have high linearity enough to suppress the level of the cross modulation distortion of the plural N of RF signals below a desired upper level.

Furthermore, the dynamic range of the common amplifier is required to become wider with increasing the number N of the RF signals described above and with increasing the area of the wireless zone formed by the radio base station.

Accordingly, even though the common amplifier is technically realizable, it is rarely put into practical use because of costs and other constraints.

The cross modulation distortion described above, as shown in ((4) in FIG. 14), is generally generated as a component of frequencies of summation and subtraction between the frequencies $f_1$, to $f_N$ ((1) and (2) in FIG. 14) of plural N of carrier waves assigned to the radio base station and the cross modulation distortion ((3) in FIG. 13) of frequencies equal to the frequency difference $\Delta f$ among the frequencies $f_1$ to $f_N$ on the frequency axis, as for that distortion, it is referred to hereinafter as the basic modulation product.

For simplicity, the frequency difference $\Delta f$ is assumed hereinafter that it is the frequency difference between the frequencies of adjacent carrier waves as given by $$\Delta f = f_{k+1} - f_k$$

where k is an arbitrary integer (k=1 to (N−1)).

However, the impedance or inductance of a line to be grounded inside the common amplifier generally increases with increasing the frequency $\Delta f$ of the basic modulation product described above. Similarly, the level of the basic modulation product increases.

That is, as the frequency difference $\Delta f$ between the frequencies of the plural N of RF signals contained in the multicarrier signals to be amplified increases, the level of the generated cross modulation distortion increases.

Accordingly, it has been necessary that the conventional common amplifier described above be made of a circuit having an impedance that is low enough to tolerate the level of the cross modulation distortion.

In a mobile communication system to which wideband CDMA system is applied, the frequency $\Delta f$ of the basic modulation product generally assumes large values of more than 10 MHz to tens of MHz.

Therefore, it has been difficult to use a common amplifier including the circuit of low impedance as described above unless the following conditions hold:

(1) Increase of the power consumption is tolerable under other constraints including running costs.

(2) It is possible to cope with the technical constraints on mechanical dimensions and thermal design of amplifier elements and other elements.

SUMMARY OF THE INVENTION

It is an object of the present invention to provide a high-frequency amplifier which includes small-scale hardware but is capable of flexibly adapting itself to various frequency allocations.

It is another object of the invention to provide a high-frequency amplifier including a small-scale circuit that can accomplish high power efficiency and a high SN ratio.

It is a further object of the invention to provide a high-frequency amplifier that can stably maintain SN ratio even if there are a large number of carrier waves used for the generation of multicarrier signals to be amplified or even if the frequencies of these carrier waves are allocated in a various or variable manner.

It is yet another object of the invention to provide a high-frequency amplifier applied in electronic appliances, equipments, or systems, which can reduce them in price and size, and improve them in reliability. It is also to provide the high-frequency amplifier applied in electronic appliances and such which can also allow the maintenance and operation to be more efficient and be done at reduced costs.

The above objects are achieved by a high-frequency amplifier comprising an amplification means for amplifying a multicarrier signal generated by combining plural carrier waves modulated independently and a filtering means connected to the output terminal of the amplification means, having a passband lying within the range of the band occupied by the multicarrier signal,such transfer characteristics as to suppress the level of noise below a predetermined upper limit, the noise being generated as a modulation product between the multicarrier signal and modulation product having a frequency equal to the frequency difference $\Delta f$ in the frequency axis as a resulting product between said carrier waves, and a rejection band including the frequency difference $\Delta f$ in its range.

In this high-frequency amplifier, the noise described above mainly includes nonlinear distortion generated due to the nonlinearity of the amplification means.

Accordingly, as long as filtering characteristics adaptive to the characteristics of the amplification means and desired frequency allocation are established into the filtering means beforehand, the small-scale circuit including the amplification means and the filtering means described above can accomplish high power efficiency and high SN ratio in this high-frequency amplifier.

The aforementioned object is also achieved by the filtering means having a rejection band which has a band lower than or equal to the frequency equal to said frequency difference $\Delta f$ allotted to it.

In this high-frequency amplifier, the SN ratio is stably maintained without changing the character of the filtering means even if there are a large number of carrier waves used for the generation of multicarrier signals to be amplified or even if the frequencies of these carrier waves are allocated in a various or variable manner.

The above-described objects are also achieved by the filtering means having a rejection band having a band in which second harmonic of said multicarrier signal is distributed or a higher rejection band containing the said band allotted to it.

Therefore, harmonic components generated due to non-linearity of the amplification means are suppressed by the filtering means together with the modulation product with frequency of $\Delta f$, also enhancing the SN ratio.

The above-described objects are achieved by a high-frequency amplifier comprising: amplification means for amplifying the multicarrier signals generated by combining plural carrier waves modulated independently and the filtering means connected to the output terminal of said amplification means, having a passband lying within the range of the band occupied by said multicarrier signal and a rejection band having a band in which second harmonic of said multicarrier signal is distributed or a higher rejection band containing the said band allotted to it.

As long as filtering characteristics adaptive to the characteristics of the amplification means and desired frequency allocation are established into the filtering means beforehand, the small-scale circuit including the amplification means and the filtering means described above can accomplish high power efficiency and high SN ratio in this high-frequency amplifier.

The objects described above can also be accomplished by connecting the filtering means in parallel between said amplification means 11 and the load connected to an output side of said amplification means 11.

In the high-frequency amplifier configured as described above, the input/output impedance of the filtering means is given a value suitable for the output impedance of the amplification means and for the impedance of the load, as long as these impedance have known values.

Accordingly, the filtering characteristics of the filtering means can be set at a desired accuracy as a transfer function suitable for such impedance.

Furthermore, the objects described above are achieved by amplification element that actively accomplishes the amplification function of the amplification means configuring the high-frequency amplifier described above and which is integrated with the filtering means forming the high-frequency amplifier, thus forming an integrated circuit.

In the amplification element configured in this way, the length of a line used for the filtering means to terminate the output terminal of the amplification means is shortened by the integration with the amplification elements as described above.

Accordingly, the impedance of this line is smaller compared with the case in which the filtering means are placed outside.

High SN ratio can be achieved even if there are a large number of carrier waves used for the generation of multicarrier signals to be amplified or even if the frequency differences in the frequency axis of these carrier waves are large.

Other objects and features of the invention will be clearly shown in the following explanation based on the accompanying drawings.

DESCRIPTION OF THE PREFERRED EMBODIMENTS

Figure 1:
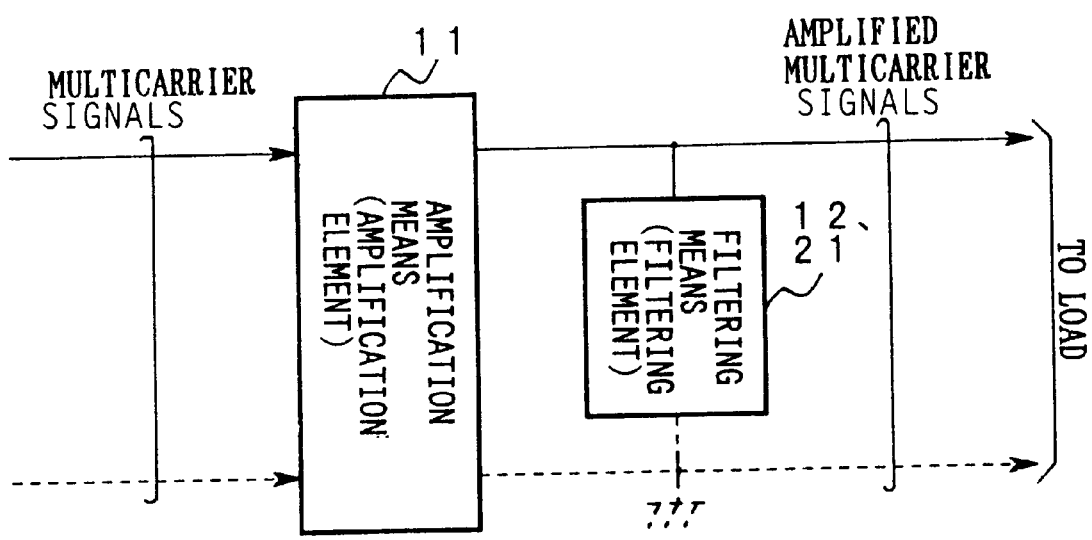
FIG. 1 is a block diagram explaining the principle of a high-frequency amplifier according to the present invention.

The principles of a high-frequency amplifier and an amplification element according to the present invention are first described. FIG. 1 is a block diagram explaining the principle of a high-frequency amplifier according to the present invention.

The amplifier shown in FIG. 1 comprises an amplification means 11 to which a multicarrier signal described later are fed and filtering means 12 and 21 connected with the output terminal of the amplification means 11.

The principle of the first high-frequency amplifier according to the present invention is as follows. The amplification means 11 amplifies a multicarrier signal generated by combining plural carrier waves modulated independently. The filtering means 12 is connected to the output terminal of said amplification means having a passband lying within the range of the band occupied by said multicarrier signal, such transfer characteristics as to suppress the level of noise below a predetermined upper limit, said noise being generated as a modulation product between the multicarrier signal and modulation product having a frequency equal to the frequency difference $\Delta f$ in the frequency axis as a resulting product between said carrier waves, and a rejection band including the frequency difference $\Delta f$ in its range.

The principle of the second high-frequency amplifier according to the present invention is as follows. The amplification element 11 amplifies a multicarrier signal generated by combining plural carrier waves modulated independently. The filtering element 12 is connected to the output terminal of said amplification means having a passband lying within the range of the band occupied by said multicarrier signal, such transfer characteristics as to suppress the level of noise below a predetermined upper limit, said noise being generated as a modulation product between the multicarrier signal and modulation product having a frequency equal to the frequency difference $\Delta f$ in the frequency axis as a resulting product between said carrier waves, and a rejection band including the frequency difference $\Delta f$ in its range.

The noise described above mainly includes nonlinear distortion generated due to the nonlinearity of the amplification means 11.

Accordingly, as long as filtering characteristics adaptive to the characteristics of the amplification means 11 and desired frequency allocation are established into the filtering means 12 beforehand, the small-scale circuit including the amplification means 11 and the filtering means 12 described above can accomplish high power efficiency and high SN ratio in this high-frequency amplifier.

The principle of the third high-frequency amplifier according to the present invention is as follows.

The filtering means 12 has a rejection band at frequencies below a frequency equal to the frequency difference $\Delta f$.

Therefore, the SN ratio is stably maintained without changing the filtering means 12 in character even if there are a large number of carrier waves used for the generation of multicarrier signals to be amplified or even if the frequencies of these carrier waves are allocated in a various or variable manner.

The principle of the fourth high-frequency amplifier according to the present invention is as follows.

The filtering means 12 has a band in which second harmonic of said multicarrier signal is distributed or a higher rejection band containing the said band allotted to it.

In particular, harmonic components generated due to nonlinearity of the amplification means 11 are suppressed by the filtering means 12 together with the modulation product with frequency of $\Delta f$, also enhancing the SN ratio.

The principle of the fifth high-frequency amplifier according to the present invention is as follows.

The amplification means 11 amplifies multicarrier signals generated by combining plural carrier waves modulated independently. The filtering means 21 is connected to the output terminal of the amplification means 11, having a passband lying within the range of the band occupied by said multicarrier signal and a rejection band having a band in which second harmonic of said multicarrier signal is distributed or a higher rejection band containing the said band allotted to it.

The principle of the sixth high-frequency amplifier according to the present invention is as follows. The amplification element 11 amplifies multicarrier signals generated by combining plural carrier waves modulated independently. The filtering element 21 is connected to the output terminal of the amplification means 11, having a pass band lying within the range of the band occupied by said multicarrier signal and a rejection band having a band in which a second harmonic of said multicarrier signal is distributed or a higher rejection band containing the said band allotted to it.

Accordingly, as long as filtering characteristics adaptive to the characteristics of the amplification means 11 and desired frequency allocation are established into the filtering means 12 beforehand, the small-scale circuit including the amplification means 11 and the filtering means 12 described above can accomplish high power efficiency and high SN ratio in this high-frequency amplifier.

The principle of the seventh high-frequency amplifier according to the present invention is as follows.

Filtering means 12 and 21 are connected in parallel between the amplification means 11 and the load connected to an output side of the amplification means 11.

That is, the input/output impedance of the filtering means 12 and 21 are given values suitable for the output impedance of the amplification means 11 and for the impedance of the load, as long as these impedance have known values.

Accordingly, the filtering characteristics of the filtering means 12 and 21 can be set at a desired accuracy as a transfer function suitable for such impedance.

Figure 2:
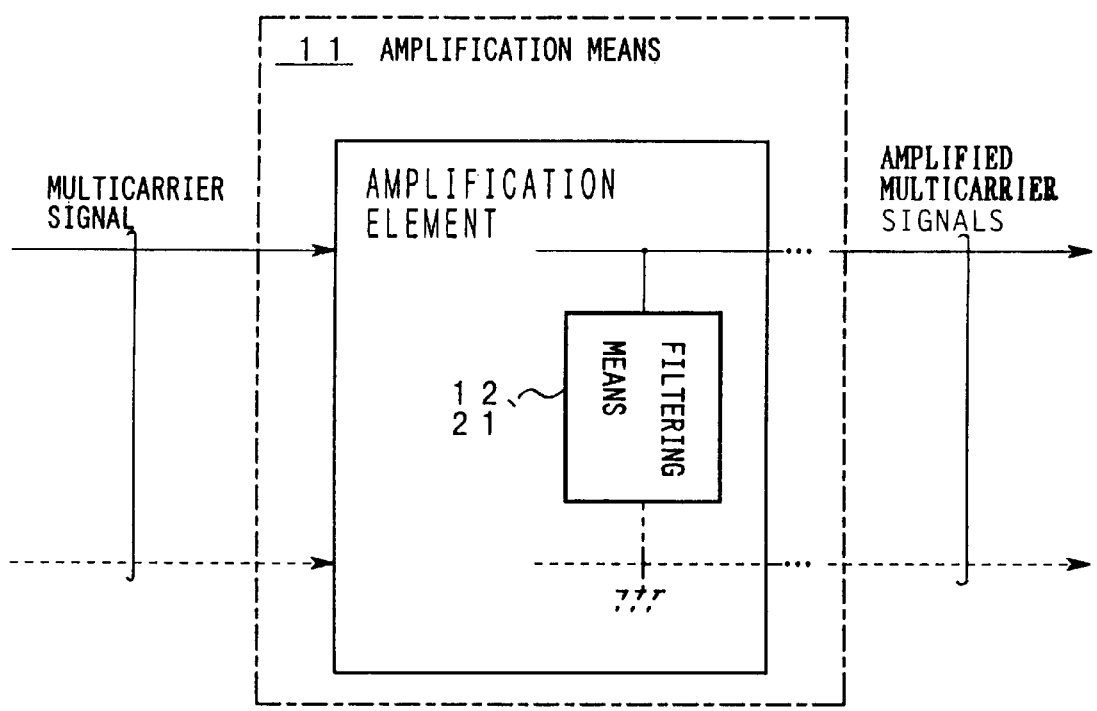
FIG. 2 is a block diagram explaining the principle of an amplification element according to the present invention.

FIG. 2 is a block diagram explaining the principle of an amplification element according to the present invention.

The amplification element is configured by integrating with filtering means 12 and 21 to form an integrated circuit.

The principle of the amplification element according to the present invention is as follows.

The amplification element is configured by amplifying a multicarrier signal generated by combining plural carrier waves modulated independently and integrating with either one of the filtering means 12 and 21 described above to form an integrated circuit.

In particular, since either filtering means 12 or 21 is integrated as described above, the length of the line leading to the termination of the output terminal of the amplification element according to the present invention is shorter than in the case where the filtering means 12 or 21 is not integrated.

Accordingly, the impedance of this line is smaller compared with the case in which the filtering means 12 or 21 are placed outside.

Also, high SN ratio can be achieved even if there are a large number of carrier waves used for the generation of multicarrier signals to be amplified or even if the frequency differences in the frequency axis of these carrier waves are large.

Embodiments of the present invention are hereinafter described in detail by referring to the accompanying drawings.

Figure 3:
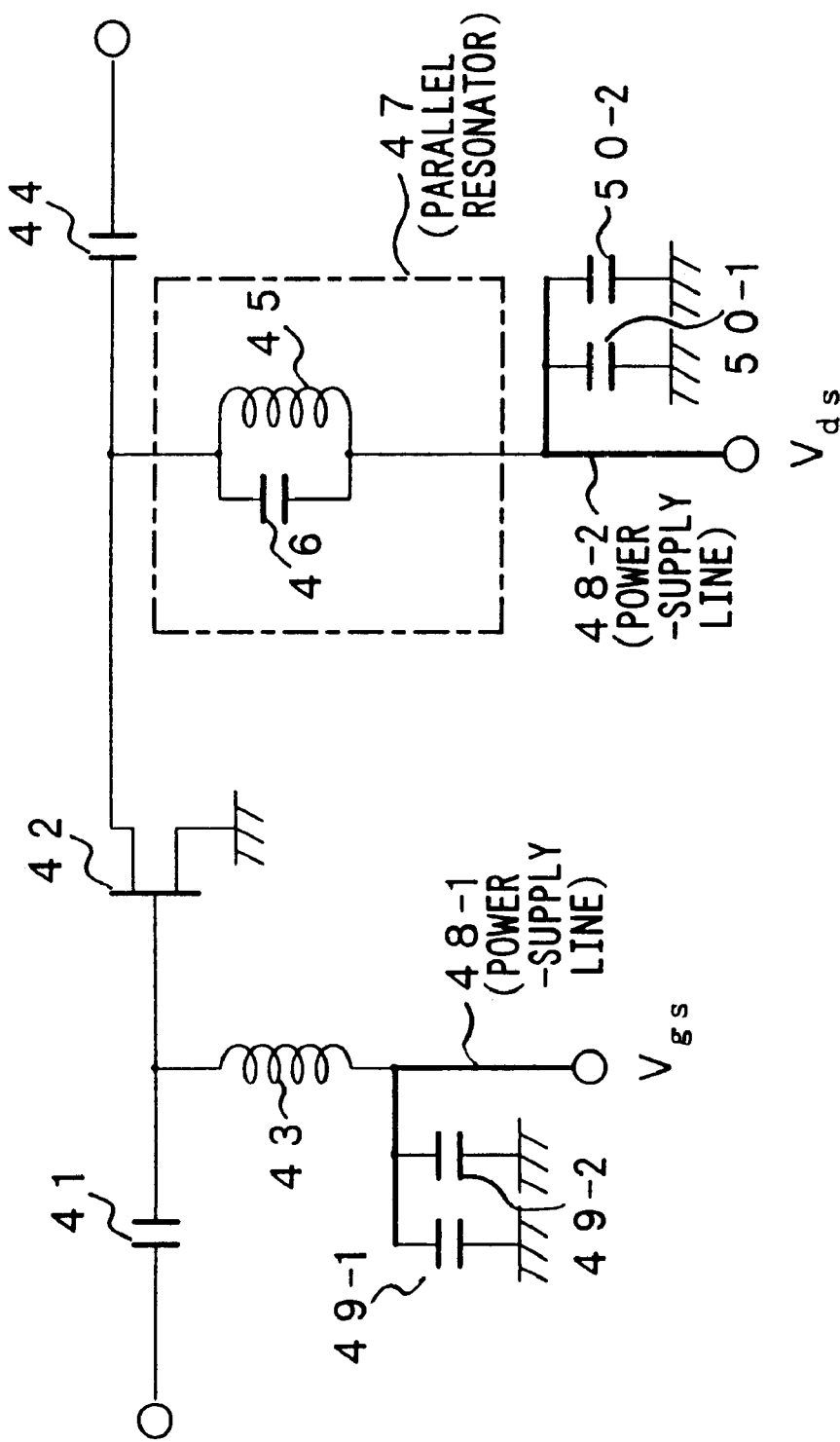
FIG. 3 is a circuit diagram of a first embodiment of a high-frequency amplifier according to the present invention.

FIG. 3 shows the first embodiment of the high-frequency amplifier according to the invention.

In the figure, an input terminal is connected via a capacitor 41 to the gate of a FET 42 that is an amplification means and an amplification element. A given bias voltage Vgs is applied to the gate of the FET 42 via an inductor 43. The source of the FET 42 is grounded. The drain of the FET 42 is connected to an output terminal via a capacitor 44. A given power-supply voltage Vds is applied to the drain of the FET 42 via a parallel resonator 47 which is filtering means and including a parallel combination of an inductor 45 and a capacitor 46. Power-supply lines 48-1 and 48-2 for supplying the bias voltage Vgs and the power-supply voltage Vds individually, are grounded via capacitors 49-1 and 49-2, and via capacitors 50-1 and 50-2, respectively.

Figure 4:
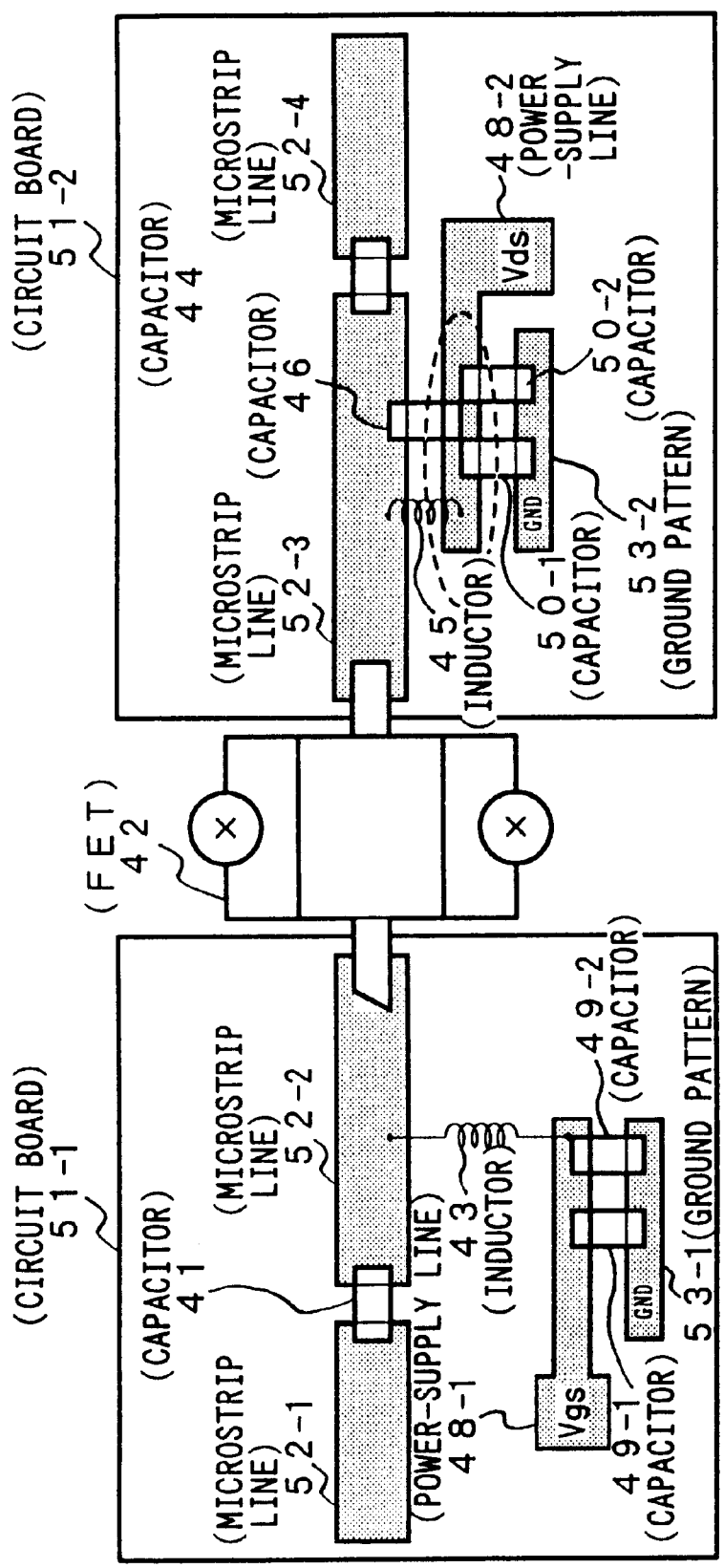
FIG. 4 is an assembly drawing of the first embodiment of the high-frequency amplifier according to the present invention.

FIG. 4 is an assembly drawing of the first embodiment of the high-frequency amplifier according to the present invention.

In the figure, the same components are indicated by identical reference numerals as in FIG. 3.

Rectangular microstrip lines 52-1 and 52-2 cascaded and the power-supply line 48-1 and a ground pattern 53-1 which both includes rectangular lines arranged parallel to the microstrip lines 52-1 and 52-2 are formed on one face of a circuit board 51-1. A capacitor 41 is connected across opposite ends of the microstrip lines 52-1 and 52-2. An inductor 43 is connected across the microstrip line 52-2 and the power-supply line 48-1. Capacitors 49-1 and 49-2 are connected in parallel between the power-supply line 48-1 and the ground pattern 53-1.

On one face of circuit board 51-2, rectangular microstrip lines 52-3 and 52-4 cascaded, a power-supply line 48-2 including a rectangular line arranged in parallel to the microstrip lines 52-3 and 52-4, and a ground pattern 53-2 are formed. The gate of an FET 42 is connected to the end of the microstrip line 52-2 opposite to the end connected to the capacitor 41, while the drain of the FET 42 is connected to one end of the microstrip line 52-3. A capacitor 44 is connected across the end of the microstrip line 52-3 that is opposite to the end connected to the drain of the FET 42 and one end of the microstrip line 52-4. An inductor 45 and a capacitor 46 are connected across the microstrip line 52-3 and the power-supply line 48-2. Capacitors 50-1 and 50-2 are connected across the power-supply line 48-2 and the ground pattern 53-2.

The corresponding relations between the components shown in FIG. 1 and the present embodiment are as follows. The capacitors 41, 44, 49-1, 49-2, 50-1, and 50-2, FET 42, inductors 43 and 45, and power-supply lines 48-1 and 48-2 correspond to the amplification means 11. The parallel resonator 47 corresponds to the filtering means 12.

Figure 5:
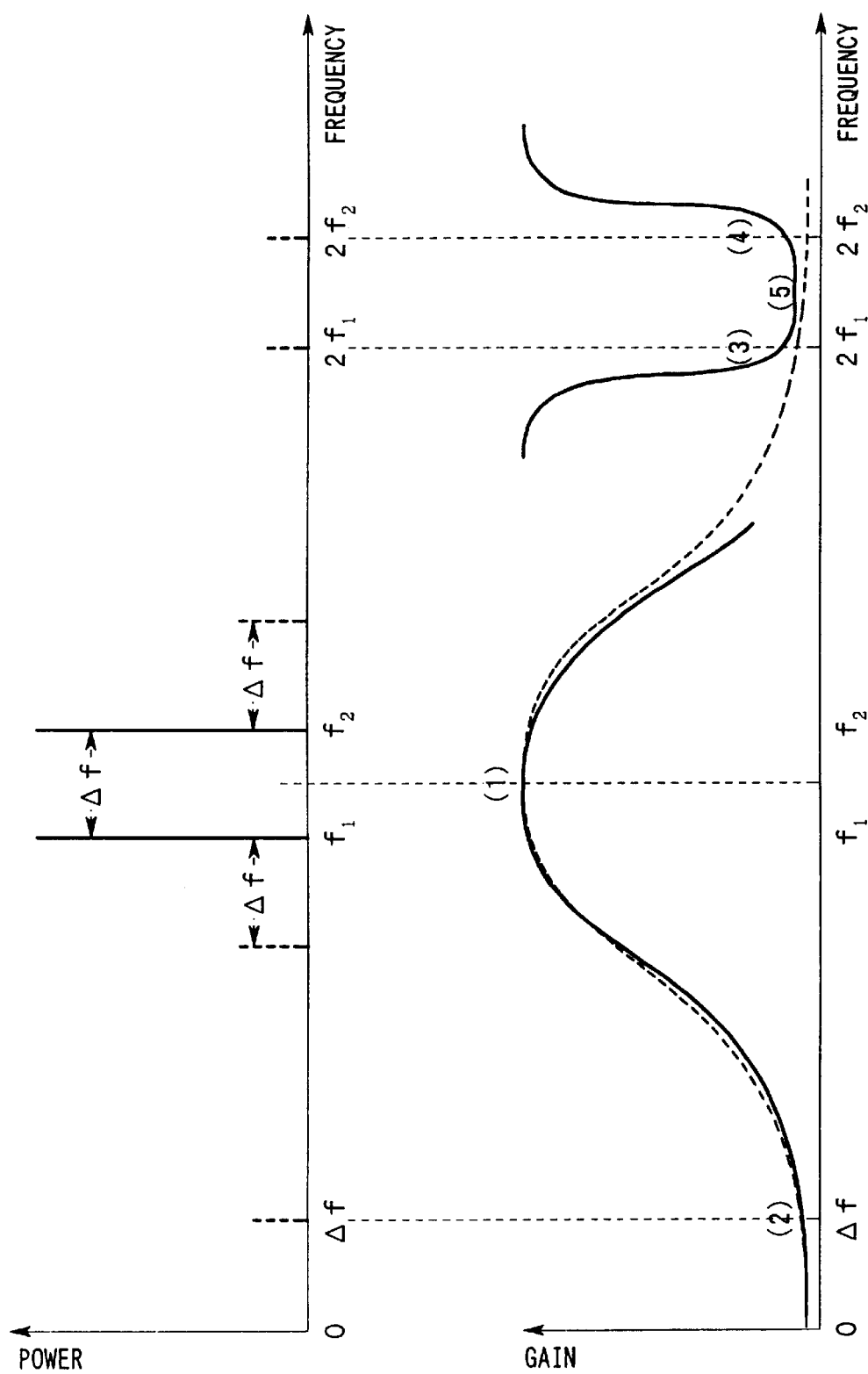
FIG. 5 is an illustration explaining the operation of the high-frequency amplifier according to the present invention.

The operation of the first embodiment of the high-frequency amplifier according to the present invention is illustrated in FIG. 5.

The operation of the present embodiment is described by referring to FIGS. 3 through 5 as follows. The bias voltage Vgs and the power-supply voltage Vds described above are applied to the FET 42 so that the operating point of the FET 42 can be set at an appropriate operating point as an amplifier either class AB or B.

The capacitance of the capacitors 41 and 44, the inductance of the inductors 43 and 45, and the characteristic impedance and line lengths of the microstrip lines 52-1 through 52-4 are preset to the value respectively so as to achieve impedance matching between the FET 42 and circuits arranged in the prior and subsequent stages with desired accuracy.

The capacitance of the capacitors 49-1, 49-2, 50-1, and 50-2 are preset in relation to the multicarrier signals to be amplified such that the impedance of the power-supply lines 48-1 and 48-2 is to be desired small values. Furthermore, the multicarrier signals are generated by combination of RF signals having carrier frequencies of $f_1$ to $f_N$, respectively. For simplicity, it is assumed that the only two waves of $f_1$ and $f_2$ exist.

The inductance of the inductor 45 included in the parallel resonator 47 and the capacitance of the capacitor 46 are preset so as to satisfy conditions (1) and (2) given as follows.

(1) The resonant frequency fr of the parallel resonator 47 is equal to the value of $fr=(f_1+f_2)/2$ with a desired accuracy ((1) in FIG. 5).

(2) Within the range of nonlinear deviation of the FET 42, the level of the cross modulation distortions is suppressed to a permissible level ((2) in FIG. 5) where the cross modulation distortions are generated such that the level of the basic modulation product described above is given as the modulation product of the basic modulation product under the combination of the respective impedance of an internal equivalent circuit connected to the drain of the FET 42, the capacitor 44, and a subsequent stage of circuit to be connected via the capacitor 44.

Since the components of basic modulation product generated during the process of amplifying the multicarrier signals described above are suppressed to a desired level by the parallel resonator 47, the cross modulation distortions generated as the modulation product of the basic modulation product are similarly suppressed.

In this way, according to the present embodiment, as long as the resonant frequency, the quality factor, and the impedance of the parallel resonator 47 are adapted to a desired frequency allocation by a circuit of a simple configuration including the parallel resonator 47 which terminates the output terminal together with a following stage of circuit, and set to the values that satisfy the conditions (1) and (2) described above, multicarrier signals of a desired level can be obtained with high SN ratio.

Furthermore, according to the present embodiment, plural RF signals contained in multicarrier signals are simultaneously amplified with high SN ratio. Therefore, costs for maintenance and operations can be reduced, as well as the power consumption. In addition, the constraint of the office establishment of radio base station according to the present embodiment is alleviated and the reliability is enhanced.

In this embodiment, the frequencies $f_1$ to $f_N$ of the carrier waves are given as known values, based on the desired frequency allocation.

It is to be understood that even if such frequency allocation is not known, the present invention can be applied to various kinds of frequency allocations by presetting the amplitude characteristic of the parallel resonator 47 to the level where the level of the basic modulation product capable of being distributed in a band lower than or equal to the maximum value is suppressed to a desired level as long as the band occupied by the multicarrier signals to be amplified and the maximum value of the frequency difference between the frequencies of the carriers on the frequency axis are known.

In the present embodiment, the quality factor of the parallel resonator 47 is set to the value that satisfies the condition (2) described above.

However, in the case when the quality factor is preset to a value where the second harmonics of the multicarrier signals is suppressed lower than or equal to a desired value, the spurious characteristics and power efficiency are both enhanced as indicated by (3) and (4) in FIG. 5.

Furthermore, in the present embodiment, one end of the parallel resonator 47 is directly connected to the power-supply line 48-2 so that the resonator is grounded in a way of alternating current.

Figure 6:
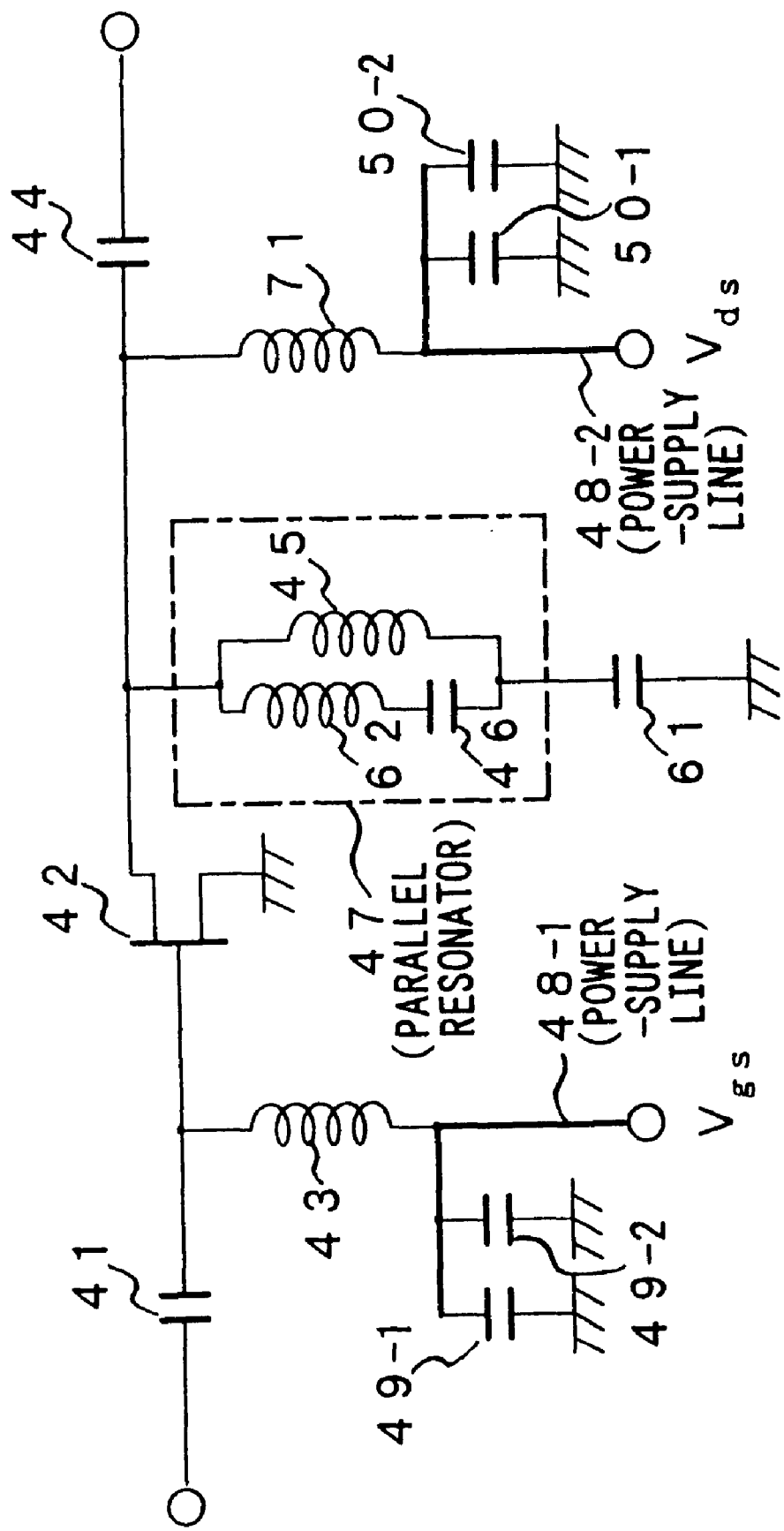
FIG. 6 is a circuit diagram showing another configuration of the first embodiment.

However, as shown in FIG. 6, one end of the parallel resonator 47 may be directly grounded via a capacitor 61 that blocks the D.C. coupling where the impedance in the band occupied by the multicarrier signals is sufficiently smaller than the impedance of the parallel resonator 47. Indicated by 62 is an inductor where the impedance against the multicarrier signals is quite small in FIG. 6.

In a further feature of the present embodiment, the parallel resonator 47 is adapted as a filter for suppressing the level of the basic modulation products to a desired value.

Figures 7A, 7B:
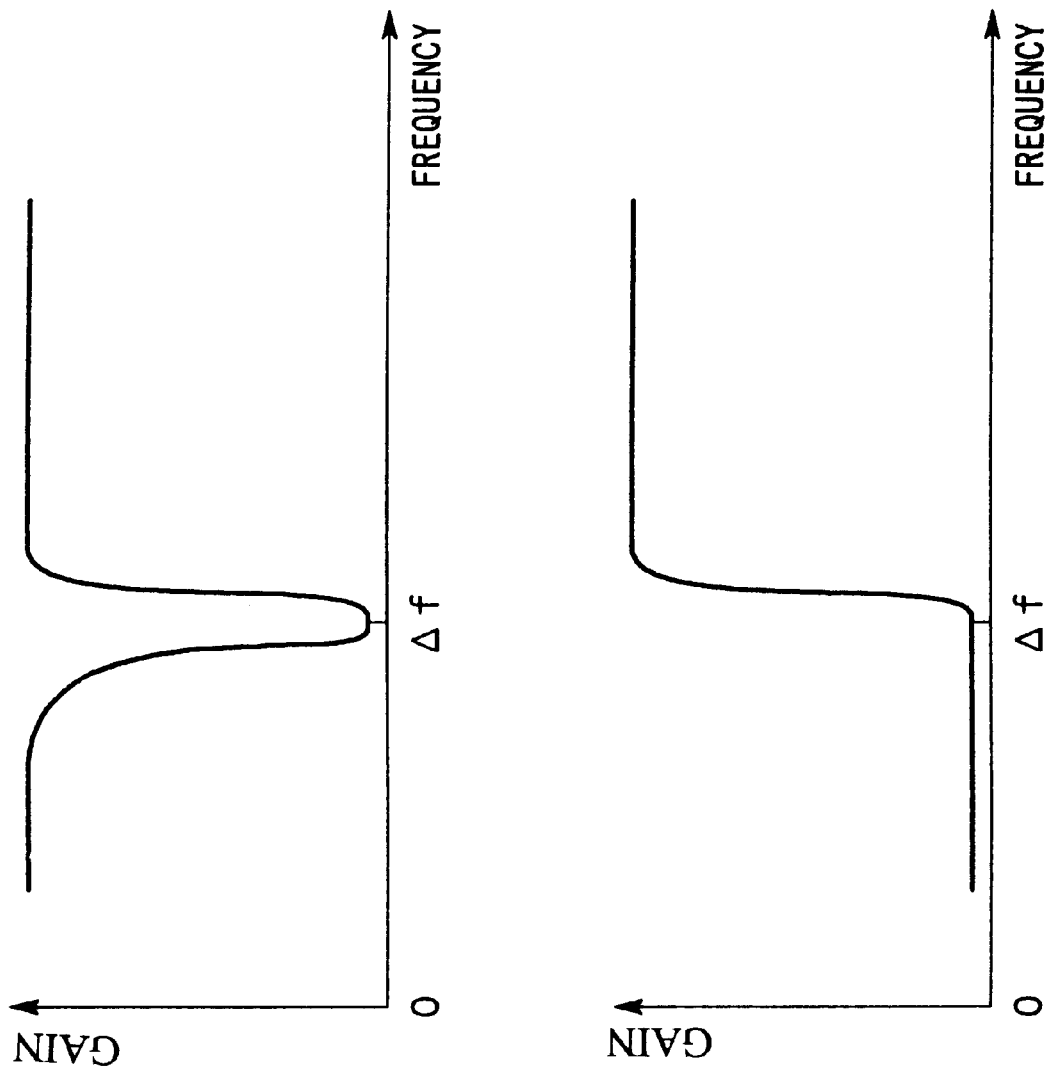
FIGS. 7(a) and 7(b) are diagrams showing the amplitude characteristics of a filter substituting for a parallel resonator.

However, the parallel resonator 47 may be replaced either by a notch filter having an attenuation pole at the frequency Δf of the basic modulation products (FIG. 7 (a)) or by a filter having a passband at lower frequencies containing the frequency Δf (FIG. 7 (b)), if the filter has characteristics of being adapted for the desired frequency allocation and suppressing basic modulation products that can be generated under the frequency allocation.

Figure 8:
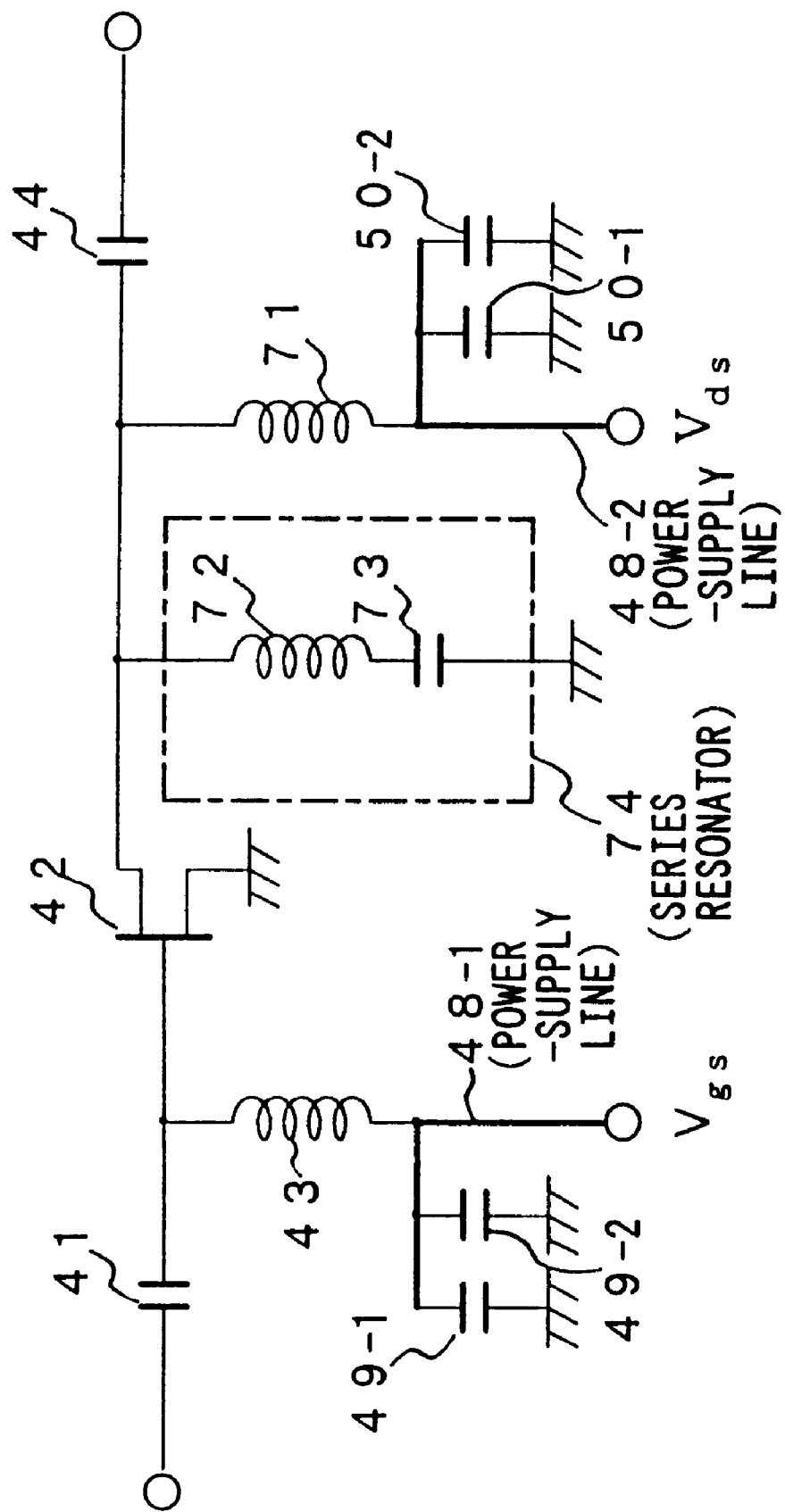
FIG. 8 is a circuit diagram of a second embodiment of a high-frequency amplifier according to the invention.

FIG. 8 shows the second embodiment of the high-frequency amplifier according to the present invention.

In the figure, the same components and functions are indicated by identical reference numbers as shown in FIG. 3 and the description thereof will be omitted here.

The differences of the configurations between the present embodiment and the embodiment shown in FIG. 3 are that the parallel resonator 47 is replaced by an inductor 71 and that the drain of the FET 42 is grounded via a series resonator 74 including an inductor 72 and a capacitor 73 cascaded.

As for the corresponding relations between the present embodiment and the components shown in FIG. 1, it is the same as those in the first embodiment described above except that the series resonator 74 including the inductor 72 and the capacitor 73 corresponds to the filtering means 21.

Figure 9:
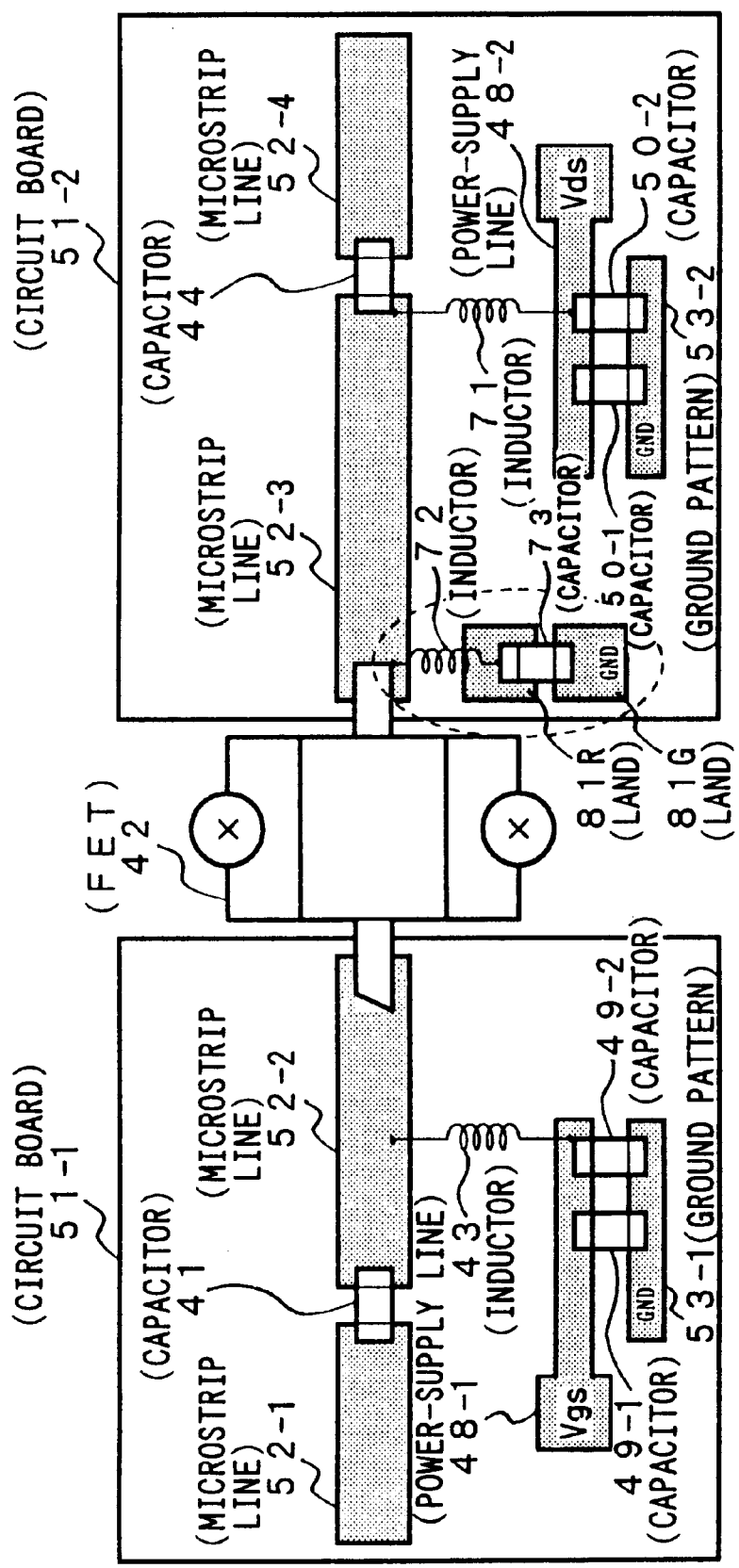
FIG. 9 is an assembly drawing of the second embodiment of the high-frequency amplifier according to the present invention.
Figure 10A:
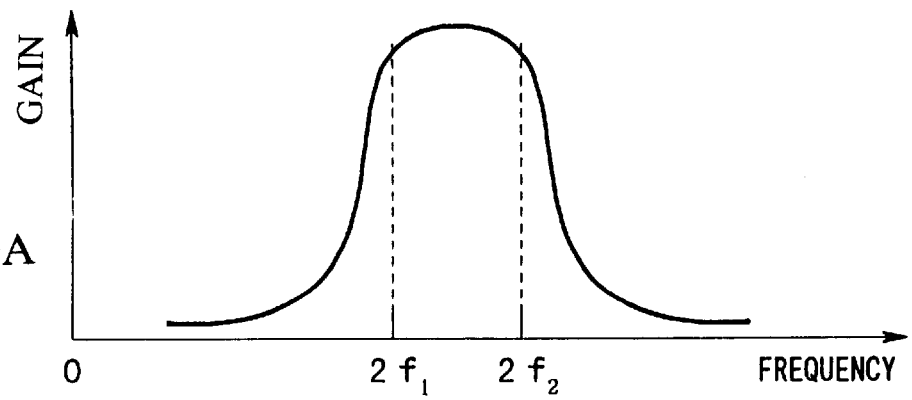
FIGS. 10(a), 10(b) and 10(c) are diagrams the amplitude characteristics of a filter substituting for a series resonator.
Figure 10B:
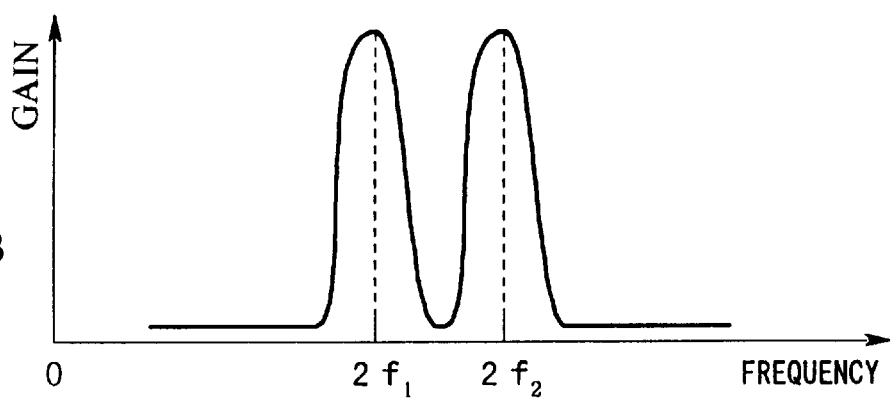
Figure 10C:
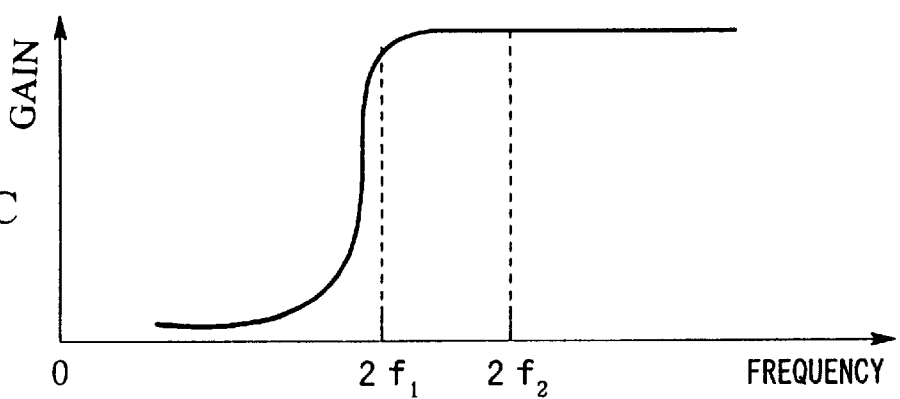

FIG. 9 is an assembly drawing of the second embodiment of the high-frequency amplifier according to the present invention.

In the figure, the same components and functions are indicated by identical reference numbers as shown in FIG. 4 and the description thereof will be omitted here The differences on the component side between the present embodiment and the embodiment shown in FIG. 3 are as follows.

(1) On the surface of the circuit board 51-2 on which the micro strip line 52-3, a rectangular land 81R is formed at a given distance from the vicinity of one end of the micro strip line 52-3 to which the drain of the FET 42 is connected.

(2) A grounded rectangular land 81G is also formed at a given distance from the land 81R.

(3) The inductor 72 is connected across one end of the microstrip line 52-3 and the land 81R.

(4) The inductor 71 is connected across the other end of the microstrip line 52-3 and the power-supply line 48-2.

(5) The capacitor 73 is connected across the lands 81R and 81G.

The operation of the present embodiment will be explained in the following by referring to FIGS. 5, 8, and 9.

The inductor 71 forms a path, from the power-supply line 48-2 to the drain of the FET 42, supplying driving D.C. power.

This inductor 71 has an inductance that achieves impedance matching between the FET 42 and the subsequent stage connected via the capacitor 44.

The inductance of the inductor 72 composing the series resonator 74 and the capacitance of the capacitor 73 are preset to values satisfying the following conditions (a) and (b).

(a) As indicated by (5) in FIG. 5, the resonant frequency fr of the series resonator 74 is set almost to the center of the band occupied by the second harmonics of the multicarrier signals.

(b) The impedance matching described above is maintained with high accuracy and a desired transfer characteristic can be obtained in the band occupied by the multicarrier signals.

Since the series resonator 74 suppresses the higher harmonics generated during the process amplifying the multicarrier signals, spurious characteristics are improved compared with the prior art.

In the present embodiment, the second harmonics of the multicarrier signals are suppressed by the series resonator 74.

However, for example, as shown in FIG. 10 FIG. 10(a), FIG. 10(b) and FIG. 10(c), the series resonator 74 may be replaced by;

(a) a bandpass filter having a passband lying in a band where the second harmonics are distributed, (b) a comb filter having passbands at frequencies twice as the frequencies of the respective carriers included in the multicarrier signals, (c) a high-pass filter having a rejection band at frequencies lower than or equal to the band in which the higher harmonics are distributed.

Figure 11:
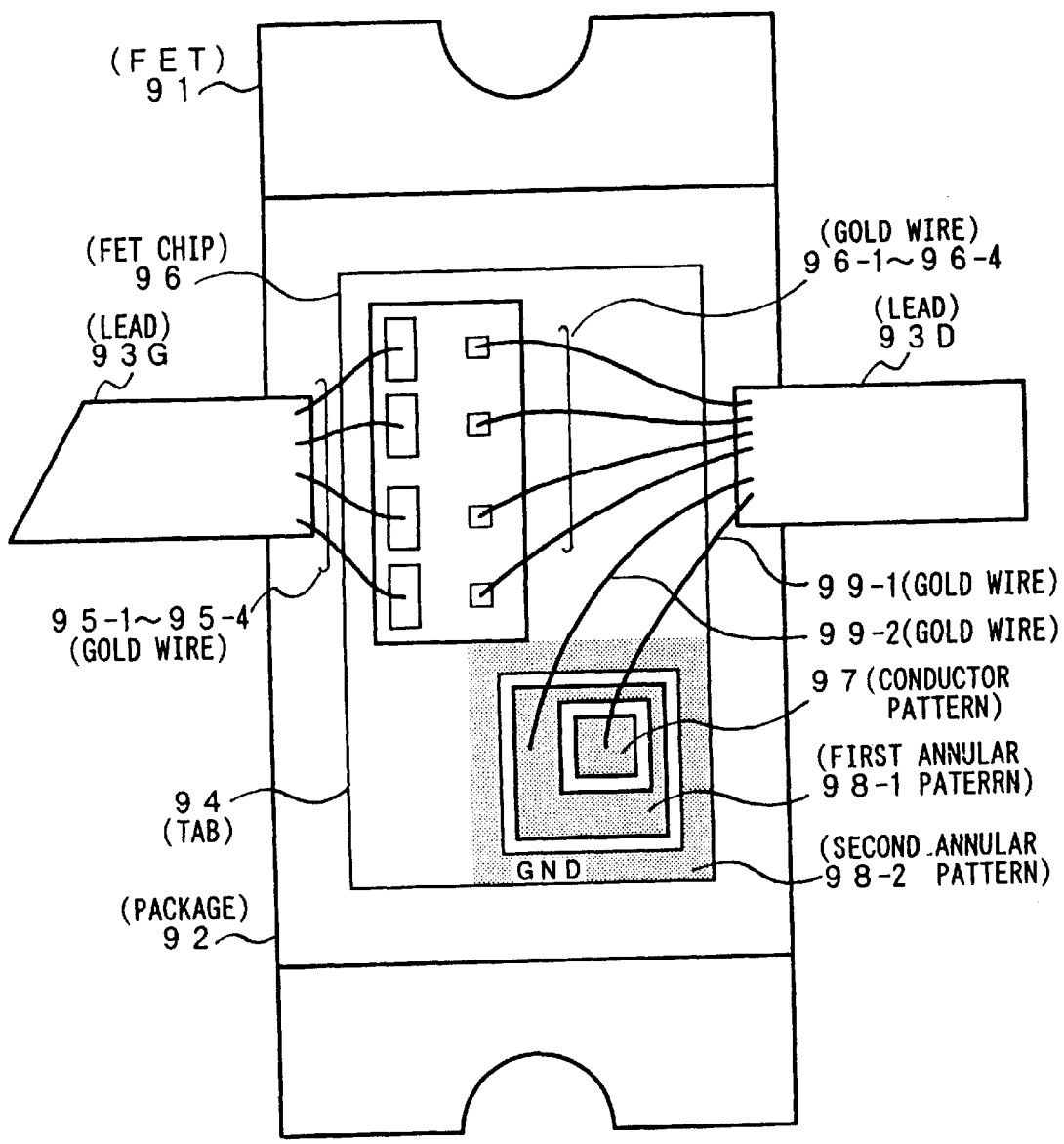
FIG. 11 is a plan view of a first embodiment of an amplification element according to the present invention.

FIG. 11 shows the first embodiment of the amplification element according to the invention.

In the figure, the same components are indicated by identical reference numbers as shown in FIG. 6 and the description thereof will be omitted here.

The feature of the embodiment shown in FIG. 6 lies in the configuration of a FET 91 that can be mounted instead of the FET 42.

The FET 91 is comprised of the following components:

(1) a package 92 serving also as a source terminal, (2) leads 93G and 93D which are mounted via insulating material (not shown) to the package 92 and corresponding to the source terminal and drain terminal, (3) a tab 94 mounted on a given surface inside the package 92 together with the leads 93G and 93D, (4) an FET chip 96 placed on the tab 94, connected to the lead 93G via gold wires 95-1 through 95-4, and connected to the lead 93D via gold wires 96-1 through 96-4,
(5) a rectangular conductor pattern 97 placed on the tab 94 together with the FET chip 96,
(6) the first annular pattern 98-1 formed around the conductor pattern 97 separated by space,
(7) the second annular pattern 98-2 formed around the first annular pattern 98-1 separated by space and grounded to the tab 94(the package 92),
(8) a gold wire 99-1 connected across the lead 93D and the conductor pattern 97,
(9) and gold wire 99-2 connected across the lead 93D and the first conductor pattern 98-1.

The corresponding relation between the present embodiment and the components shown in FIG. 2 is as follows. The conductor pattern 97, the first annular pattern 98-1, the second annular pattern 98-2, and the gold wires 99-1 and 99-2 correspond to the filtering means 12.

In the FET 91 configured as described above, the conductor pattern 97, the first conductor pattern 98-1, and the second conductor pattern 98-2 are laminated or formed as films on the tab 94 according to desired shape, dimensions, and arrangement. A relative permittivity intrinsic in the material of the surface on which these patterns should be formed is preset to a desired value to form a capacitor having the same capacitance as the capacitor 46 between the conductor pattern 97 and the first conductor pattern 98-1. Also, another capacitor having the same capacitance as the capacitor 61 is formed between the first conductor pattern 98-1 and the second conductor pattern 98-2.

The gold wires 99-1 and 99-2 are previously shaped into desired forms and given predetermined dimensions so as to be inductors corresponding to the inductors 62 and 45, respectively.

That is, the parallel resonator 47 and the capacitor 61 shown in FIG. 6 are integrally formed inside the FET 91 that can be mounted instead of the FET 42. One end of the capacitor 61 is directly grounded to the tab 94 (the package 92) corresponding to the source of the FET 91.

In this manner, in the present embodiment, the cross modulation products are suppressed efficiently even if the distance of the plural carriers included in the multicarrier signals is large since the basic modulation products are suppressed with high accuracy compared with the case when the parallel resonator 47 is grounded outside of the FET 42 as indicated by the dotted line in FIG. 6.

Figure 12:
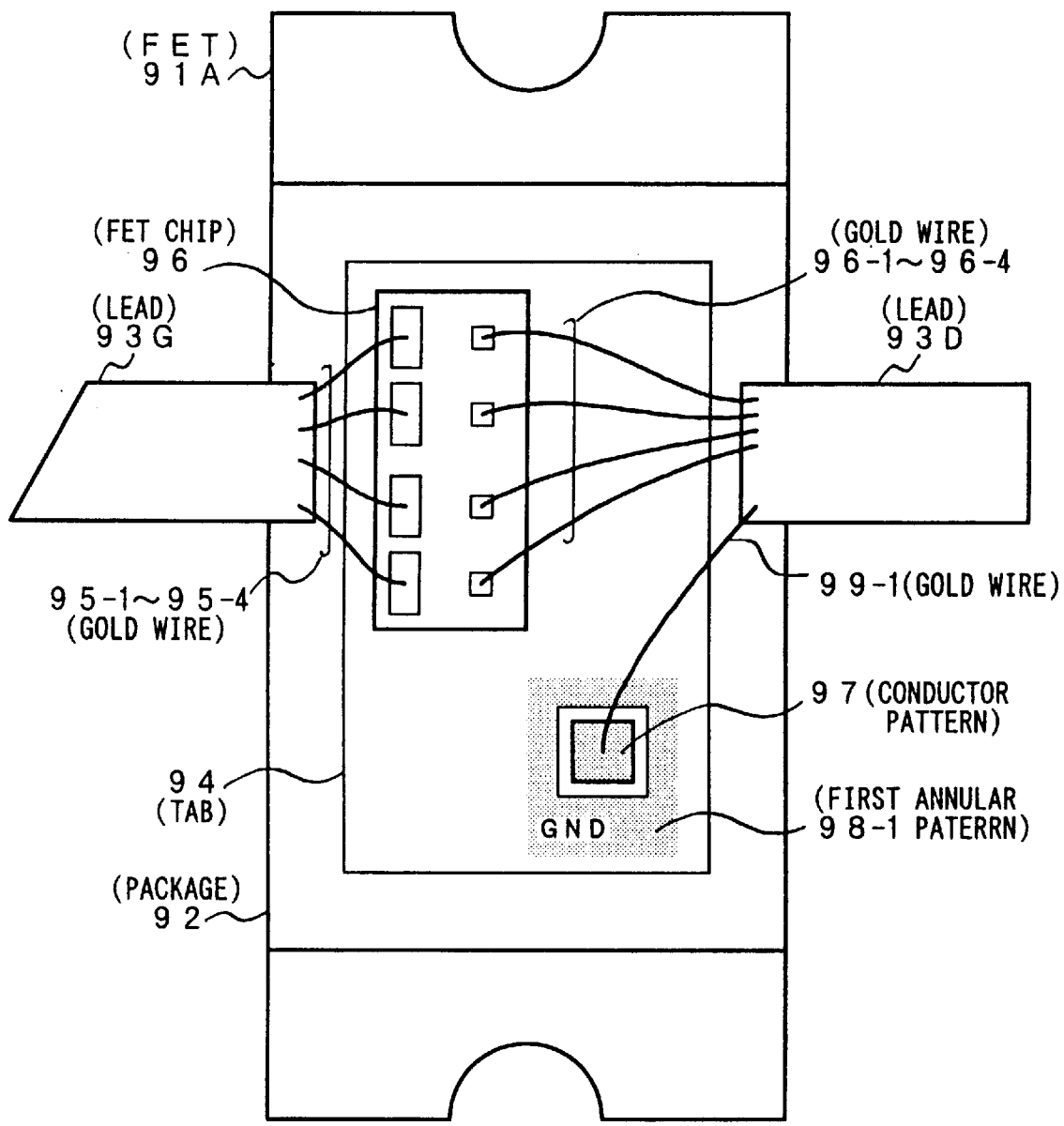
FIG. 12 is a plan view of a second embodiment of an amplification element according to the invention.
Figure 13:
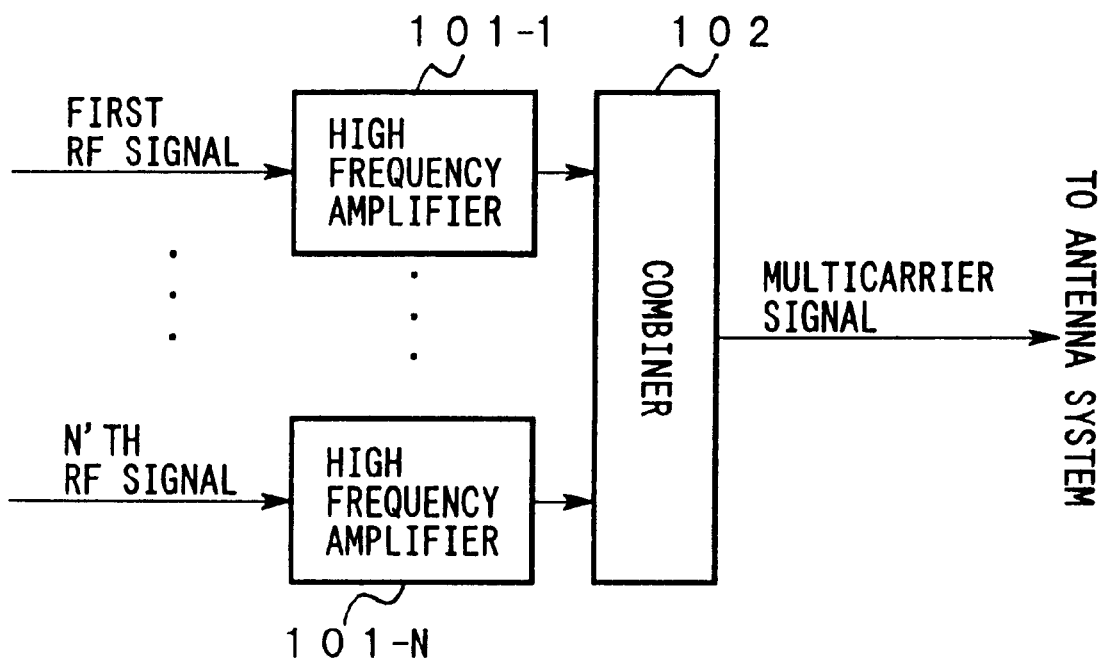
FIG. 13 is a schematic diagram of a power amplifier section of a transmission system applicable to the CDMA system.
Figure 14:
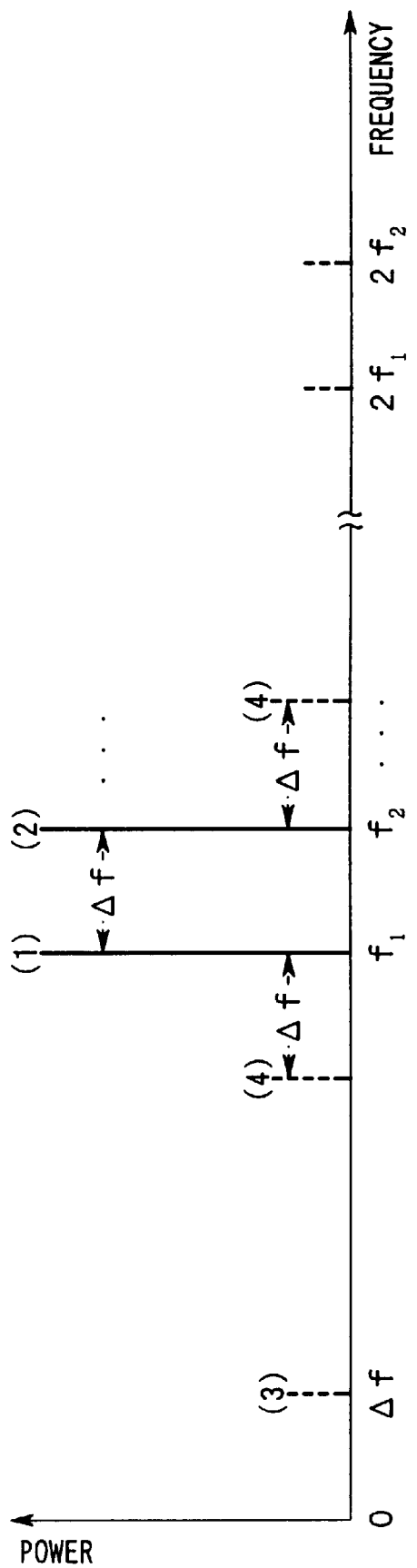
FIG. 14 is a diagram illustrating the frequency allocation for multicarrier signals and the distribution of cross modulation distortions that can be generated.

FIG. 12 shows the second embodiment of the amplification element according to the present invention.

In the figure, the same components are indicated by identical reference numerals as in FIGS. 8 and 11 and the description thereof will be omitted here.

The feature of the present embodiment shown in FIG. 8 lies in the configuration of a FET 91A that can be mounted instead of the FET 42.

The differences of the configurations between the FET 91A and the FET 91 shown in FIG. 11 are that the second annular pattern 98-2 is not formed, the first annular pattern 98-1 is grounded to the tab 94 (package 92), and the gold wire 92-2 is not provided.

Furthermore, as for the corresponding relation between the present embodiment and the block diagram of FIG. 2, the conductor pattern 97, the first annular pattern 98-1, and the gold wire 99-1 correspond to the filtering means 21.

In the FET 91A configured as described above, the conductor pattern 97 and the first conductor pattern 98-1 are laminated or formed as films on the tab 94 according to desired shape, dimensions, and arrangement. A relative permittivity intrinsic in the material forming the surface on which these patterns are to be formed is preset to a given value. Therefore, a capacitor having the same capacitance as the capacitor 73 is formed between the conductor pattern 97 and the first conductor pattern 98-1.

The gold wire 99-1 is previously shaped into desired form and given predetermined dimensions so as to be inductor corresponding to the inductor 72.

That is, the parallel resonator 47 shown in FIG. 8 is integrally formed inside the FET 91A that can be mounted instead of the FET 42. One end of the parallel resonator 47 is directly grounded to the tab 94 (the package 92) corresponding to the source of the FET 91A.

In this manner, in the present embodiment, the second harmonics are suppressed with high accuracy compared with the case when the drain of the FET 42 is grounded via the series resonator 74 placed outside of the FET 42, as indicated by the dotted line in FIG. 9. Hence, the SN ratio is enhanced.

Furthermore, in the present embodiment, the FET chip 96 and the parallel resonator 47 or the series resonator 74 are placed on the tab 94 and connected together via the gold wires 96-1 through 96-4, 99-1, 99-2, and the lead 93D so as to be integrated as a multichip integrated circuit.

However, the gold wires 96-1 through 96-4, 99-1, and 99-2 may be integrated with the parallel resonator 47 or the series resonator 74 to form a monolithic integrated circuit or a hybrid integrated circuit, for example.

In the respective embodiments described above, the present invention is applied to the transmitting section of a mobile communication system to which CDMA system is applied.

It is to be understood, however, that the present invention can be applied to any electronic appliances, equipments, or systems in which the multicarrier signals described above are amplified, irrespective of the multiple access method, modulation method, frequency band, frequency allocation, or channel frequency assignment.

Furthermore, the present invention can be similarly applied to a transmitting section or a receiving section that performs given processing in an RF band or IF band within a wireless transmission system or wire transmission system other than a mobile communication system.

In the respective embodiments described above, the present invention is applied to a class AB power amplifier using the FETs 42, 91, and 91A as amplification elements.

However, the present invention can be applied regardless of whether a feedback circuit is added or not, depending on the amplification elements, the operating point of the amplification elements, the system of the circuit used for coupling to the prior or subsequent stage, the level, the frequency band, and the bandwidth occupied by the multicarrier signals to be amplified, the gain, the SN ratio, the linearity, and the power efficiency to be achieved.

It is to be noted that the invention is not limited to the embodiments described above but rather various changes and modifications are possible within the scope of the present invention. Furthermore, any improvement may be made in a part or within the whole apparatus.

What is claimed is:

1. A high-frequency amplifier comprising:
   an amplification means for amplifying a multicarrier signal generated by combining plural carrier waves modulated independently; and
   a filtering means connected to the output terminal of said amplification means, having:

a passband lying within the range of the band occupied by said multicarrier signal, such transfer characteristics as to suppress the level of noise below a predetermined upper limit, said noise being generated as a modulation product between the multicarrier signal and modulation product having a frequency equal to the frequency difference Δf in the frequency axis as a resulting product between said carrier waves, and a rejection band including said frequency difference Δf in its range.

2. A high-frequency amplifier comprising:

an amplification element for amplifying a multicarrier signal generated by combining plural carrier waves modulated independently; and a filtering element connected to the output terminal of said amplification element, having:

a passband lying within the range of the band occupied by said multicarrier signal, such transfer characteristics as to suppress the level of noise below a predetermined upper limit, said noise being generated as a modulation product between the multicarrier signal and modulation product having a frequency equal to the frequency difference Δf in the frequency axis as a resulting product between said carrier waves, and a rejection band including said frequency difference Δf in its range.

3. The high-frequency amplifier as claimed in claim 1, wherein said rejection band of said filtering means has a band lower than or equal to the frequency equal to said frequency difference Δf allotted to it.

4. The high-frequency amplifier as claimed in claim 1, wherein said rejection band of said filtering means has a band in which second harmonic of said multicarrier signal is distributed or a higher rejection band containing the said band allotted to it.

5. The high-frequency amplifier as claimed in claim 3, wherein said rejection band of said filtering means has a band in which second harmonic of said multicarrier signal is distributed or a higher rejection band containing the said band allotted to it.

6. A high-frequency amplifier comprising:

an amplification means for amplifying multicarrier signals generated by combining plural carrier waves modulated independently; and a filtering means connected to the output terminal of said amplification means, having:

a passband lying within the range of the band occupied by said multicarrier signal, a rejection band having a band in which second harmonic of said multicarrier signal is distributed or a higher rejection band containing the said band allotted to it.

7. A high-frequency amplifier comprising:

an amplification element for amplifying multicarrier signals generated by combining plural carrier waves modulated independently; and a filtering element connected to the output terminal of said amplification element, having:

a passband lying within the range of the band occupied by said multicarrier signal, a rejection band having a band in which second harmonic of said multicarrier signal is distributed or a higher rejection band containing the said band allotted to it.

8. The high-frequency amplifier as claimed in claim 1, wherein said filtering means is connected in parallel between said amplification means and the load connected to an output side of said amplification means.

9. The high-frequency amplifier as claimed in claim 3, wherein said filtering means is connected in parallel between said amplification means and the load connected to an output side of said amplification means.

10. The high-frequency amplifier as claimed in claim 4, wherein said filtering means is connected in parallel between said amplification means and the load connected to an output side of said amplification means.

11. The high-frequency amplifier as claimed in claim 5, wherein said filtering means is connected in parallel between said amplification means and the load connected to an output side of said amplification means.

12. The high-frequency amplifier as claimed in claim 6, wherein said filtering means is connected in parallel between said amplification means and the load connected to an output side of said amplification means.

13. An amplification element, wherein:

an output terminal is connected to a filtering means, having:

a passband lying within the range of the band occupied by multicarrier signals generated by combining plural carrier waves modulated independently, such transfer characteristics as to suppress the level of noise below a tolerable upper limit, said noise being generated as modulation products between the multicarrier signals and modulation products having frequencies equal to the frequency difference Δf in the frequency axis as a resulting product between said carrier waves, and a rejection band including said frequency difference Δf in its range;

said amplification element is integrated with said filtering means to form an integrated circuit; and said amplification element amplifies said multicarrier signals.

14. An amplification element, wherein:

an output terminal is connected to a filtering means having a passband lying within the range of the band occupied by multicarrier signals generated by combining plural carrier waves modulated independently and a rejection band having a band in which second harmonic of said multicarrier signals are distributed or a higher rejection band containing the said band allotted to it;

said amplification element is integrated with said filtering means to form an integrated circuit; and said amplification element amplifies said multicarrier signals.

* * * * *